(12) United States Patent
Gier

(10) Patent No.: US 6,311,572 B1
(45) Date of Patent: Nov. 6, 2001

(54) DISPLACEMENT SENSOR

(75) Inventor: Lothar Gier, Bad Nauheim (DE)

(73) Assignee: Mannesmann VDO AG (DE)

( * ) Notice: Subject to any disclaimer, the term of this patent is extended or adjusted under 35 U.S.C. 154(b) by 0 days.

(21) Appl. No.: 09/207,836

(22) Filed: Dec. 8, 1998

(30) Foreign Application Priority Data

Dec. 9, 1997 (DE) .............................................. 197 54 524

(51) Int. Cl.$^7$ .......................... G01B 121/10; G01B 7/00; G01B 11/00; G01P 3/50; G01M 17/04
(52) U.S. Cl. ..................................... 73/865.9; 250/231.18
(58) Field of Search ...................... 73/865.9; 250/231.18; 702/94

(56) References Cited

U.S. PATENT DOCUMENTS

| | | | | |
|---|---|---|---|---|
| 4,183,014 | * | 1/1980 | McClean et al. | 250/231.18 X |
| 4,712,106 | * | 12/1987 | McNally | 702/94 X |
| 6,029,118 | * | 2/2000 | Strasser | 702/94 |

* cited by examiner

*Primary Examiner*—Thomas P. Noland
(74) *Attorney, Agent, or Firm*—Meyer, Brown & Platt

(57) ABSTRACT

A displacement sensor for acquiring the position of two parts that can be moved relative to one another is described. A sequence of markings are placed on the first part and a plurality of sensors are placed on the second part. The sensors detect each of the sequence of markings as they pass each sensor. To determine the absolute position of the two parts relative to one another without additional, special reference markings, each individual marking has a specific distance from neighboring markings and the absolute position is calculated from the phase shift of the signals of sensors as movement of the sequence of markings is detected. If the speed of movement is not known, this can be determined by means of additional secondary sensors, which are provided at a certain axial distance from the first sensors. The speed of movement of the two parts relative to one another can be calculated using the time delay of the signals from the sensors and secondary sensors. The calculated speed of movement can then be used to calculate the absolute position of the two parts relative to one another.

16 Claims, 1 Drawing Sheet

DISPLACEMENT SENSOR

BACKGROUND

1. Field of the Invention

This invention relates generally to displacement sensors and particularly to a displacement sensor for acquiring the position of two parts which can be moved relative to one another wherein the first part has at least one sensor and the second part has a sequence of spaced-apart markings that trigger the sensor.

2. Related Art

Displacement sensors are required wherever it is necessary to acquire the exact position of two parts that can be moved relative to one another. In this case, it is usual for a sensor or a plurality of sensors to be placed on the first of the two parts. A sequence of markings is placed on the second of the two parts on a scale at constant distances, and the sequence of markings can be detected by the sensors on the first part. The markings can be detected optically, electrically-capacitively, magnetically or by any other detection method. In the event of relative displacement of the two parts, the sensors count the markings that sweep past the sensors as the two parts move with respect to one another. The result is an incremental displacement sensor that is unable to determine the absolute position of the two parts. To determine the absolute position of the two parts, additional reference markings are required that can be detected as absolute reference points from which the displacement markings can then be counted in a relative manner.

For example, it is known to provide a fine thread on a hydraulic piston rod made of magnetic material with the fine thread being filled with a non-magnetic material to smooth the piston rod. The turns of the fine thread form the individual markings on the piston rod. The piston rod is guided in an annular bearing having a plurality of magnetic sensors arranged on the circumference of the annular bearing. These magnetic sensors can be, for example, of magneto-resistive design or Hall sensors. When the piston rod is displaced, the magnetic sensors react with a certain phase shift as each individual marking passes a magnetic sensor. In this way, the magnetic sensors acquire the number of markings that have moved past each magnetic sensor as the piston rod moves, and the displacement distance is calculated as the product of the number of activations of the magnetic sensor times the thread pitch.

The above described arrangement enables the resolution of the incremental displacement sensor to be increased by increasing the number of magnetic sensors in the system. The resolution corresponds to the pitch of the thread divided by the number of magnetic sensors on the circumference of the annular bearing. It is also possible to draw a conclusion about the direction of movement from the order in which the sensors respond. However, the absolute position of the two parts relative to one another cannot be calculated. To measure the absolute position, markings of a different material than the material filling the threads that can be detected as reference position are introduced in the thread. However, each additional reference marking signifies a considerable increased outlay in the production and evaluation of the displacement sensor.

In the prior displacement sensors, after movement of the piston rod occurs when the displacement sensor is in the power-off state, the absolute position of the piston rod is initially unknown after the displacement sensor has been switched on again. When displacement sensors are integrated, for example, in shock absorbers or struts of motor vehicles, problems may arise when the vehicle has been loaded with the voltage supply of the displacement sensor switched off because, when the vehicle is started, a completely incorrect position is assumed by the displacement sensor.

An example of the type of problem that may result is in vehicles that adjust the angle of the headlights based on the values received from the displacement sensor. Because the displacement sensor is reading the incorrect absolute value, the headlights are adjusted according to the incorrectly assumed absolute value and may shine at such an angle as to impair the vision of other drivers. Even in prior art displacement sensors that include reference markings to determine the absolute position, when the vehicle is traveling slowly on a flat road there may be little chassis movement, and it is possible that initially no reference position will pass a magnetic sensor where the magnetic sensors are situated exactly between two reference markings. The incorrect headlight setting may therefore be maintained as the journey progresses even when the displacement sensor includes reference markings.

An object of the present invention is to provide a displacement sensor that can, without special reference markings, determine the absolute position of two parts that can be moved relative to one another.

SUMMARY OF THE PRESENTLY PREFERRED EMBODIMENT

According to a preferred embodiment of the present invention, two parts that are a moving relative to one another are equipped with a sensor or plurality of sensors on the first part and markings on the second part, as described above. However, each marking on the second part has a predefined distance from its neighboring markings with regard to the direction of movement. This allows a computer to calculate, from the phase shift of the signals of a sensor or multiple sensors on the first part, the distance between the markings passing by the sensors. Because these distances are predefined and known, the absolute position of the two parts relative to one another can be calculated.

In a preferred embodiment, the multiple sensors are arranged on the first part in a plane transverse to the direction of movement of the second part, allowing a determination of the distance between markings based on the phase shift of the sensor signals. This allows the absolute position of the two parts relative to one another to be determined with sufficient accuracy when the speed of movement is known, since the predefined distances between the markings is known and a fixed mathematical relationship exists between the distances and the phase shift of the sensor signals. As a result, the absolute position of the two parts relative to one another can be determined after at least two markings have passed a sensor with a known stroke speed.

In a preferred embodiment of the present invention, at least one of the sensors is assigned a secondary sensor situated at a predefined distance from the first sensor in the direction of movement. A computer can calculate, based upon the time delay between the signals from these two sensors, the instantaneous relative speed of the movement of the second part. The computer can then use the calculated speed to determine the distance between markings during the evaluation of the phase shift of the signals of the remaining sensors.

It is thus possible to acquire the stroke speed by direct measurement as described above, enabling an exact evaluation of the absolute position even though the speed of movement between the two parts is unknown or when there is acceleration during movement. The more sensors that have secondary sensors assigned to them at a predetermined distance in the direction of movement, the more accurately absolute position can be determined when there is dynamic movement processes during the relative movement of the two parts. Therefore, an absolute reference is always available even during arbitrary rotation of the sensors on the second part with respect to the markings on the first part.

The markings on the second part can be formed by a continuous marking line around the surface of the second part having a certain pitch. The marking line constitutes a number of individual markings as it circumscribes the second part. In a preferred embodiment, the markings may comprise, for example, the individual turns of a helix with a variable pitch, said helix being provided on a cylindrical area of the second part. Depending on the type of sensors being used, the helix may be a thread around the circumference of the second part, an application of material on the second part, or merely an optical marking on the second part. The helix can be produced mechanically using very simple means. When a helix is used as the marking, the sensors are arranged on the circumference of the first part with a certain annular offset relative to one another. By increasing the number of sensors on the circumference, it is possible to increase the resolution of the displacement sensor by a factor corresponding to the number of sensors.

In principle, any type of sensor can be used in a displacement sensor according to the preferred embodiment of the invention, including optical, electrical-capacitive or magnetic sensors. When optical sensors and markings that can be read optically are used, there can be a larger distance between the sensors and the markings, minimizing or eliminating friction and wear between the two parts. Magnetic sensors and markings require a small distance between the sensors and the markings, but are much less sensitive to contamination.

In a preferred embodiment of the present invention, the second part is cylindrical, is composed of magnetic material, and a helix is provided in the form of a thread around the circumference of the cylinder whose turns are filled with a nonmagnetic material. The cylinder thus has zones of different permeability in the region of its surface. These zones can be detected by a magneto-resistive sensor or a Hall sensor.

In a preferred embodiment, the cylinder can be, for example, a hydraulic piston rod. The surface of the piston rod will often form a seal, therefore, it is usually necessary for the surface of the nonmagnetic material to be smoothly flush with the circumferential area of the piston rod. The sensors are arranged, for example, on the inner circumference of a bearing ring that guides the piston rod. In a preferred embodiment, the displacement sensor can be integrated into the shock absorbers of a motor vehicle to control intensity and direction of the illumination range of the vehicle. In alternate embodiments, displacement sensors can be assigned to any components where a first part is assigned to a sprung component of a motor vehicle and a second part is assigned to an unsprung component of a motor vehicle, or vice versa.

These and other features and advantages of the invention will be apparent upon consideration of the following detailed description of the preferred embodiments of the invention, taken in conjunction with the appended drawing.

DETAILED DESCRIPTION OF THE PRESENTLY PREFERRED EMBODIMENT

Figure 1:
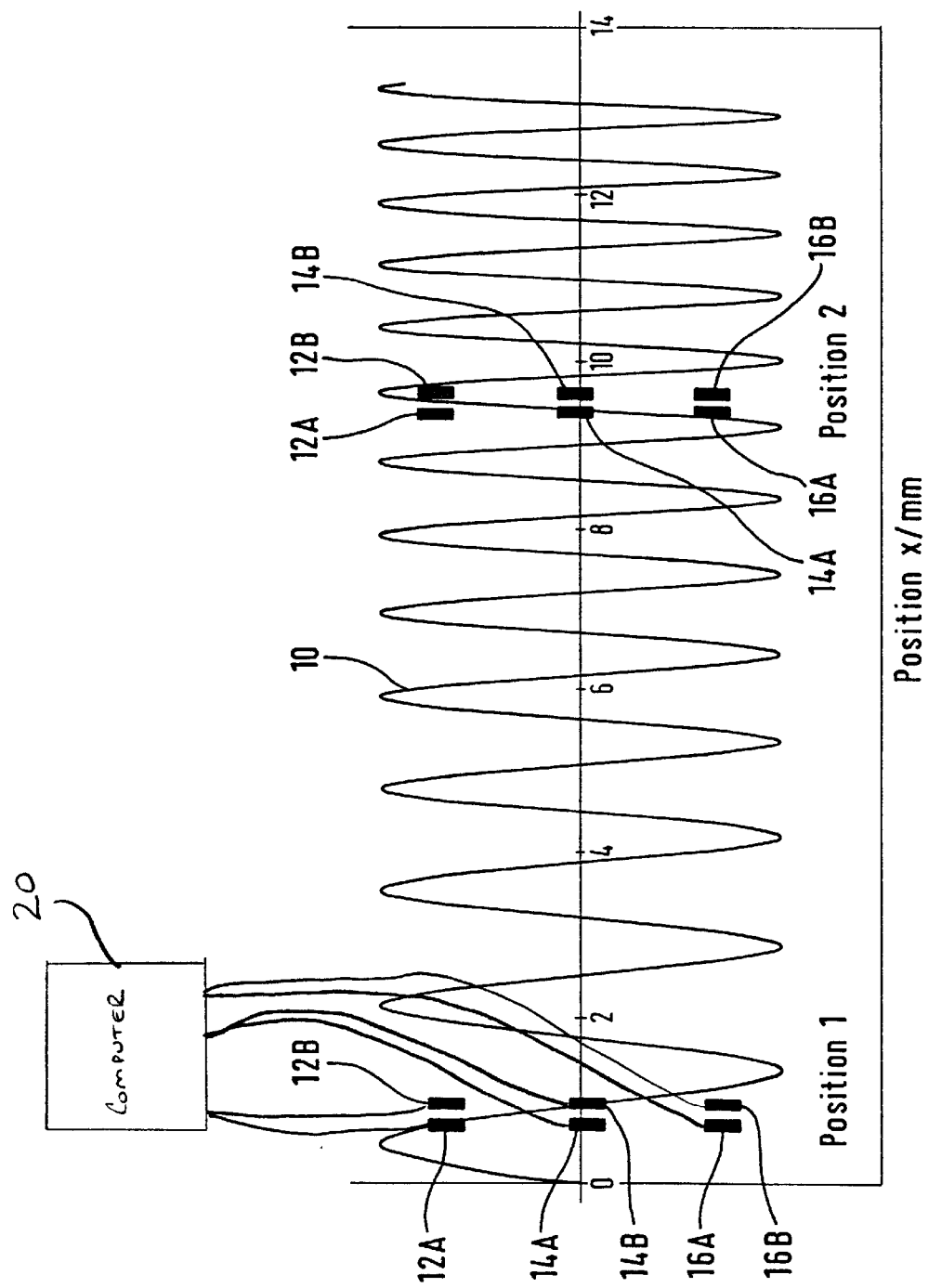
FIG. 1 is a diagram of a displacement sensor according to a preferred embodiment of the present invention.

Referring to FIG. 1, a diagram of a displacement sensor according to a preferred embodiment of the present invention is shown. A marking 10 in the form of a helical line is created on, in a preferred embodiment, a piston rod (not shown). The pitch of the marking 10 varies over the length of the piston rod according to a known, predefined mathematical relationship. In a preferred embodiment, the pitch of the marking 10 at a position x can be calculated according to the relationship $P_x = P_o \times (1 + x/s)$, where s is the total length of the piston rod containing the marking. In a preferred embodiment, $\sqrt[x/s]{P_o}$ is equal to 2 millimeters. Other mathematical relationships are also readily conceivable and can be used in the present invention.

In a preferred embodiment, three sensors 12A, 14A, and 16A are provided to detect the marking 10. The three sensors 12A, 14A, and 16A have an angular offset relative to one another around an inner circumference of a cylinder. In a preferred embodiment, the inner circumference of a cylinder is the guiding area of a guide ring (not shown) of the piston rod. Each of the sensors 1A, 14A, and 16A is assigned a secondary sensor 12B, 14B, and 16B that is located at a relatively small axial distance from each sensor 12A, 14A, and 16A. The uniform angular offset in the preferred embodiment between the sensors 12A, 14A and 16A is 120°. In general, when n sensors are used, neighboring sensors should be place 360°/n apart. In alternate embodiments, however, it is also possible to provide any desired angular distances between two sensors, as long as the angular offset between the individual sensors is exactly known and can be taken into account during the evaluation of the sensor signals.

During a stroke of the piston rod, which is usually between 80 millimeters and 200 millimeters in the case of motor vehicle shock absorbers, the sensors 12A, 14A, and 16A respond with a specific phase delay as the marking 10 passes each individual sensor 12A, 14A, or 16A. There is also a time delay between the responses of sensor 12A and secondary sensor 12B, the responses of sensor 14A and secondary sensor 14B, and the responses of sensor 16A and secondary sensor 16B. From the time interval between the responses of sensors 12A, 14A, and 16A and the responses of secondary sensors 12B, 14B, and 16B, it is possible to determine the instantaneous stroke speed of the piston rod. Since the stroke speed is determined at all three angular positions, it is possible to determine changes between the stroke speed measured at individual angular positions and, if appropriate, to interpolate the stroke speed.

With the known stroke speed, it is then possible to directly calculate from the temporal offset of the signals from two neighboring sensors 12A, 14A, or 16A the pitch of the marking 10 present at the location of the sensors 12A, 14A, and 16A. From the calculated pitch, the absolute position of the piston rod and the guide ring can be determined based on the known, predefined pitch of the marking 10 around the piston rod.

For clarification, FIG. 1 illustrates two different positions of sensors 12A, 14A, and 16A, and secondary sensors 12B, 14B, and 16B with regard to the marking 10. The pitch is approximately 2 millimeters in the region of position 1, and it is reduced to approximately 1 millimeter in the region of the position 2. Therefore, given an identical stroke speed of the piston rod, the temporal offset between the response of sensors 12A, 14A, and 16A in position 2 is half of the temporal offset between the response of sensors 12A, 14A, and 16A in position 1. The sensors 12A, 14A, and 16A and secondary sensors 12B, 14B, and 16B permit the stroke speed to be determined accurately in such a way that each individual thread turn of the marking 10 can be determined exactly by its specific pitch as the marking 10 passes by sensors 12A, 14A, and 16A and secondary sensors 12B, 14B, and 16B. In a preferred embodiment, such calculations can be performed by a computer 20.

The computer 20 receives input from sensors 12A, 14A, and 16A and secondary sensors 12B, 14B, and 16B comprising information regarding the marking 10 as described above. Note that the computer 20 is shown as being connected to one set of the sensors shown in FIG. 1 for simplicity; however, the computer 20 is connected to the sensors at all positions of the sensors. The computer 20 performs the calculations described above using the information received from sensors 12A, 14A, and 16A and secondary sensors 12B, 14B, and 16B to determine the absolute position between the guide ring and the piston rod as well as the stroke speed of the piston rod.

Once the absolute position between the plane of the sensors 12A, 14A, and 16A and the marking 10, and, correspondingly, the absolute position between the guide ring and the piston rod, has been determined, the changing absolute position can continue to be determined according to the sequence described above. However, it is also possible to determine the changing absolute position by simply counting the turns of the marking 10 that pass the individual sensors 12A, 14A, and 16A, since the distance between two successive turns, or the pitch, of the marking 10, is known after the initial absolute position is determined.

If the displacement sensor described above is integrated, for example, into the shock absorber of a motor vehicle, it is possible to calculate the absolute position after a stroke of the piston rod of a few millimeters.

In a preferred embodiment, the piston rod is made of magnetic material and the marking 10 is composed of a nonmagnetic material that is filled into an appropriately designed thread turn on the piston rod and terminates flush with the surface of the piston rod. In alternate embodiments, the marking 10 can be coded optically, capacitively or conductively and interact with corresponding sensors 12A, 14A, and 16A.

It is to be understood that a wide range of changes and modifications to the embodiments described above will be apparent to those skilled in the art and are contemplated. It is, therefore, intended that the foregoing detailed description be regarded as illustrative rather than limiting, and that it be understood that it is the following claims, including all equivalents, that are intended to define the spirit and scope of the invention.

What is claimed is:

1. A displacement sensor for acquiring the position of two parts that can be moved relative to one another, the first part being assigned at least two sensors and the second part being assigned, in the direction of movement, a sequence of markings formed by the loops of a helix with a variable pitch, said helix being provided on a cylindrical area of the second part which, when congruent with a sensor, trigger the sensor, wherein each marking has a specific distance from its neighboring markings with regard to the direction of movement and a computer calculates, from the phase shift of the signals of the sensor or of the sensors, the distance of the markings situated in the sensor region and, by assignment of the distance, determines the absolute position of the two parts relative to one another, and wherein at least two sensors lie on a plane transverse to the direction of movement which interact with the markings.

2. The displacement sensor as claimed in claim 1, wherein at least one of the sensors is assigned a further sensor situated at a certain distance in the direction of movement, the computer calculating, from the time delay between these two sensor signals, the instantaneous relative speed of the movement and taking this into account for the purpose of determining the marking distance during the evaluation of the phase shift of the signals of the remaining sensors.

3. The displacement sensor as claimed in claim 1, wherein the sensors are arranged on a circle circumference of the first part with a certain angular offset relative to one another.

4. The displacement sensor as claimed in claim 1, wherein the sequence of markings interact with the sensors optically.

5. The displacement sensor as claimed in claim 1, wherein the sequence of markings interact with the sensors electrically-capacitively.

6. The displacement sensor as claimed in claim 1, wherein the sequence of markings interact with the sensors magnetically.

7. The displacement sensor as claimed in claim 6, wherein the sensors are of a magneto-resistive design.

8. The displacement sensor as claimed in claim 6, wherein the sensors are designed as Hall sensors.

9. The displacement sensor as claimed in claim 1, wherein the second part is cylindrical, is composed of magnetic material and, in its circumferential area, the helix is provided in the form of a thread whose turns are filled with a non-magnetic material.

10. The displacement sensor as claimed in claim 9, wherein the surface of the non-magnetic material terminates smoothly flush with the circumferential area of the second part.

11. The displacement sensor as claimed in claim 10, wherein the sensors are arranged on the inner circumferential area of a bearing ring that guides the second part.

12. The displacement sensor as claimed in claim 1, wherein the first part is assigned to a sprung component of a motor vehicle and the second part is assigned to an unsprung component of a motor vehicle.

13. The displacement sensor as claimed in claim 12, wherein the first and second parts are component parts of a shock absorber of a motor vehicle, the second part forming the piston rod and the first part forming its guide.

14. A displacement sensor for acquiring the position of a first part and a second part that can be moved relative to one another comprising:

a sequence of markings coupled with the second part, wherein the second part is cylindrical and the sequence of markings comprise loops of a helix having a predetermined, variable pitch, said helix being provided on the cylindrical area of the second part;

a plurality of sensors coupled with the first part and arranged on a plane. transverse to the direction of movement of the second part relative to first part, said sensors able to detect the sequence of markings when each marking passes each sensor and outputting a signal when each marking passes each sensor; and a computer for calculating the absolute position of the first part and the second part relative to one another based on the distance between each marking in the sequence of markings as calculated from the signals produced by the at least one sensor.

15. The invention of claim 14, further comprising at least one secondary sensor coupled with the first part at a predetermined distance from at least one sensor wherein the computer can calculate instantaneous relative speed of movement of the second part relative to the first part based on the signals from the sensor and the secondary sensor.

16. The invention of claim 14, wherein the second part comprises magnetic material and the helix comprises a thread with turns filled with non-magnetic material.

* * * * *